United States Patent
Yang et al.

(10) Patent No.: US 9,224,887 B2
(45) Date of Patent: *Dec. 29, 2015

(54) SOLAR CELL AND SOLAR CELL MODULE

(71) Applicant: AU Optronics Corp., Hsin-Chu (TW)

(72) Inventors: Chun-Ming Yang, Hsin-Chu (TW);
Huang-Chi Tseng, Hsin-Chu (TW);
Yao-Hsien Chung, Hsin-Chu (TW);
Wei-Jieh Lee, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 369 days.

This patent is subject to a terminal disclaimer.

(21) Appl. No.: 13/661,018

(22) Filed: Oct. 25, 2012

(65) Prior Publication Data

US 2013/0152993 A1    Jun. 20, 2013

(30) Foreign Application Priority Data

Dec. 15, 2011    (TW) .............................. 100146636 A

(51) Int. Cl.
*H01L 31/0224* (2006.01)
*H01L 31/02* (2006.01)
*H01L 31/05* (2014.01)

(52) U.S. Cl.
CPC .... *H01L 31/022425* (2013.01); *H01L 31/0201* (2013.01); *H01L 31/0504* (2013.01); *Y02E 10/50* (2013.01)

(58) Field of Classification Search
CPC .................. H01L 31/022425; H01L 31/0201; H01L 31/0504
USPC ................................................. 136/244, 256
See application file for complete search history.

(56) References Cited

U.S. PATENT DOCUMENTS

| | | | |
|---|---|---|---|
| 5,704,992 A | 1/1998 | Willeke | |
| 7,759,158 B2 | 7/2010 | Bachrach | |
| 2002/0130605 A1 | 9/2002 | Mueller | |
| 2010/0018565 A1 | 1/2010 | Funakoshi | |
| 2011/0088746 A1 | 4/2011 | Hong | |
| 2011/0214734 A1 | 9/2011 | Lee | |

FOREIGN PATENT DOCUMENTS

| | | |
|---|---|---|
| CN | 102005493 A | 4/2011 |
| JP | H9213983 A | 8/1997 |
| JP | 2008235817 A | 10/2008 |

*Primary Examiner* — Jayne Mershon
(74) *Attorney, Agent, or Firm* — Winston Hsu; Scott Margo

(57) ABSTRACT

The present invention provides a solar cell including a substrate, a first front bus, and a first rear bus. The substrate has a front surface and a rear surface. The first front bus is located on the front surface of the substrate along a first direction for collecting current generated by the substrate, and for providing a first front contact electrode. The first rear bus is located on the rear surface of the substrate along a second direction different from the first direction for collecting current generated by the substrate, and for providing a first rear contact electrode.

18 Claims, 9 Drawing Sheets

SOLAR CELL AND SOLAR CELL MODULE

BACKGROUND OF THE INVENTION

1. Technical Field

The present invention relates to a solar cell and a solar cell module, and more particularly, to a solar cell and a solar cell module capable of saving space and improving efficiency.

2. Description of the Prior Art

Please refer to FIG. 1 to FIG. 3. FIG. 1 is a diagram showing a solar cell 100 of the prior art. FIG. 2 is a diagram showing a solar cell module 200 comprising the solar cells 100 of FIG. 1. FIG. 3 is a diagram showing connections between the solar cells 100 of the solar cell module 200 of FIG. 2. The solar cell 100 comprises a silicon substrate 110, a front bus 120, and a rear bus 130. The silicon substrate 110 has a front surface 112 and a rear surface 114. The silicon substrate 110 generates current when the front surface 112 receives light. The front bus 120 is located on the front surface 112 of the silicon substrate 110 along a first direction A for collecting current generated by the silicon substrate 110, and for providing a front contact electrode 122. The rear bus 130 is located on the rear surface 114 of the silicon substrate 110 along the first direction A for collecting current generated by the silicon substrate 110, and for providing a rear contact electrode 132. A polarity of the front contact electrode 122 is opposite to a polarity of the rear contact electrode 132. The solar cell module 200 comprises a plurality of solar cell strings 210. Each of the solar cell strings 210 comprises a plurality of solar cells 100 electrically connected to each other in series along the first direction A. The front contact electrode 122 of each solar cell 100 is electrically connected to the rear contact electrode 132 of adjacent solar cell 100 via a conducting strip 220. The solar cell module 200 further comprises conducting bars 230 arranged along a second direction B for electrically connected the solar cell strings 210 in series. The conducting bars 230 are located around the solar cell strings 210 for being electrically connected with the conducting strips 220. According to the above arrangement, all the solar cell strings 210 are electrically connected in series for providing electricity.

SUMMARY OF THE INVENTION

A embodiment of the resent invention provides a solar cell comprising a substrate, a first front bus, and a first rear bus. The substrate has a front surface and a rear surface. The first front bus is located on the front surface of the substrate along a first direction for collecting current generated by the substrate, and for providing a first front contact electrode. The first rear bus is located on the rear surface of the substrate along a second direction different from the first direction for collecting current generated by the substrate, and for providing a first rear contact electrode.

Another embodiment of the present invention further provides a solar cell module comprising a first solar cell string, a second solar cell string, and a first conducting strip. The first solar cell string comprises a plurality of first solar cells electrically connected to each other in series along a first direction. The plurality of first solar cells comprises a first bridge solar cell. The second solar cell string comprises a plurality of second solar cells electrically connected to each other in series. The plurality of second solar cells comprises a second bridge solar cell. The first conducting strip is for electrically connecting a surface of the first bridge solar cell to a surface of the second bridge solar cell along a second direction different from the first direction, wherein the plurality of second solar cells are electrically connected to each other in series along a third direction different from the second direction.

Another embodiment of the present invention further provides a solar cell module comprising a first solar cell string, a second solar cell string, and a first conducting strip. The first solar cell string comprises a plurality of first solar cells electrically connected to each other in series along a first direction. The plurality of first solar cells comprises a first bridge solar cell with a first lateral surface. The second solar cell string comprises a plurality of second solar cells electrically connected to each other in series along a second direction. The plurality of second solar cells comprises a second bridge solar cell with a second lateral surface opposite to the first lateral surface. A first space is formed between four edges of the first lateral surface and four edges of the second lateral surface. The first conducting strip is for electrically connecting the first bridge solar cell to the second bridge solar cell. The first conducting strip has a first contact part, a second contact part, and a transmission part, wherein the first contact part is electrically connected to the first bridge solar cell, the second contact part is electrically connected to the second bridge solar cell, and the transmission part connected between the first contact part and the second contact part is arranged inside the first space.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
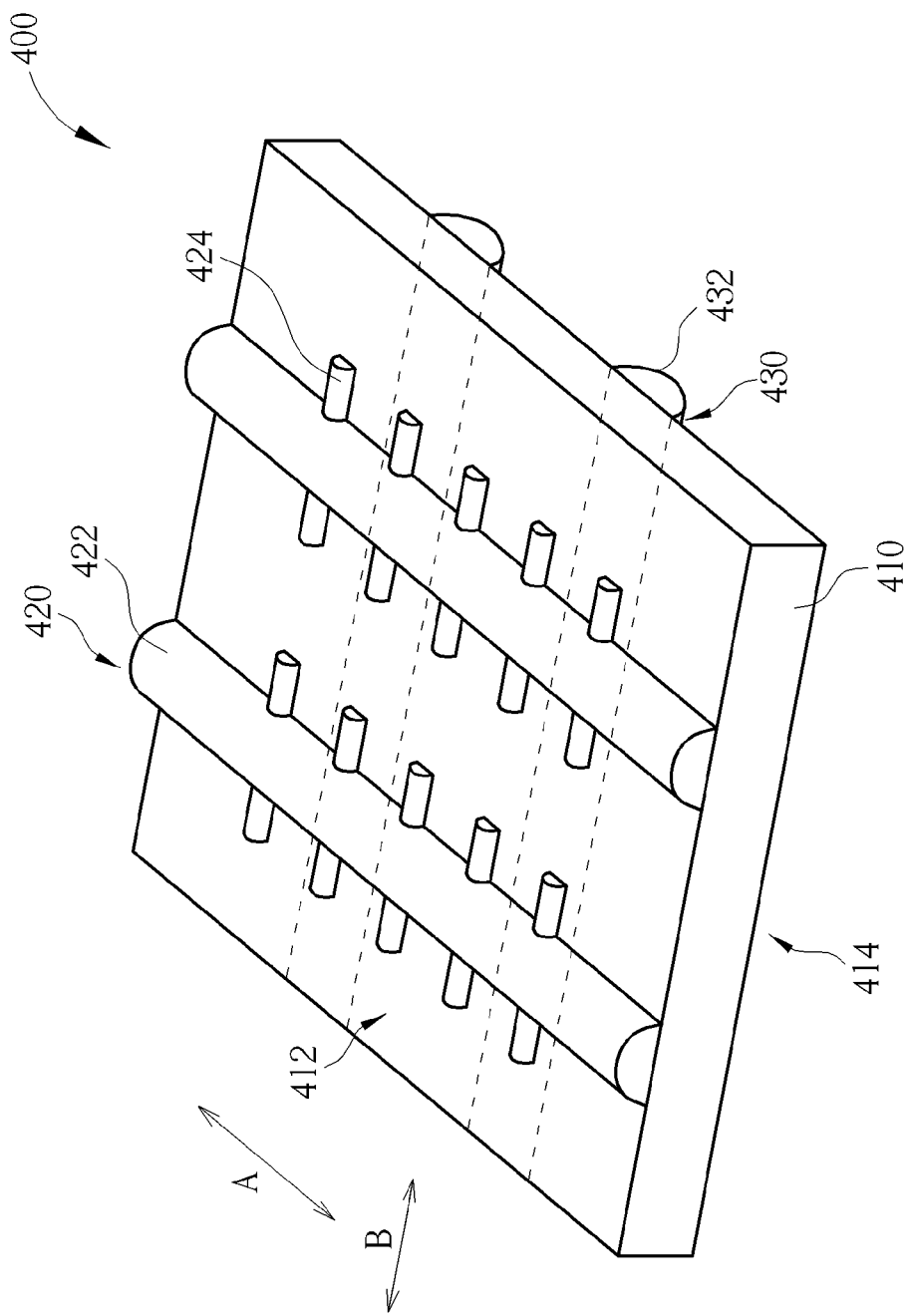
FIG. 4 is a diagram showing a first embodiment of a solar cell of the present invention.

Please refer to FIG. 4. FIG. 4 is a diagram showing a first embodiment of a solar cell of the present invention. The solar cell 400 of the present invention comprises a substrate 410, a front bus 420, and a rear bus 430. The substrate 410 can be made of silicon or any other photovoltaic material. The substrate 410 has a front surface 412 and a rear surface 414. The substrate 410 generates current when the front surface 412 receives light. The front bus 420 is located on the front surface 412 of the substrate 410 (in other words, the front bus 420 and the front surface 412 are at the same side of the solar cell 400) along a first direction A for collecting current generated by the substrate 410, and for providing a front contact electrode 422. The rear bus 430 is located on the rear surface 414 of the substrate 410 (in other words, the rear bus 430 and the rear surface 422 are at the same side of the solar cell 400)

along a second direction B different from the first direction A (such as perpendicular to the first direction A) for collecting current generated by the substrate 410, and for providing a rear contact electrode 432. A polarity of the front contact electrode 422 is opposite to a polarity of the rear contact electrode 432. The solar cell 400 can further comprise a plurality of front finger buses 424 electrically connected to the front bus 420. The front finger buses 424 are extended from the front bus 420 for assisting the front bus 420 in collecting current. The contact electrode 422, 432 provided by the front bus 420 and the rear bus 430 can be electrically connected to the front finger buses 424 via the conducting strips.

Figure 1:
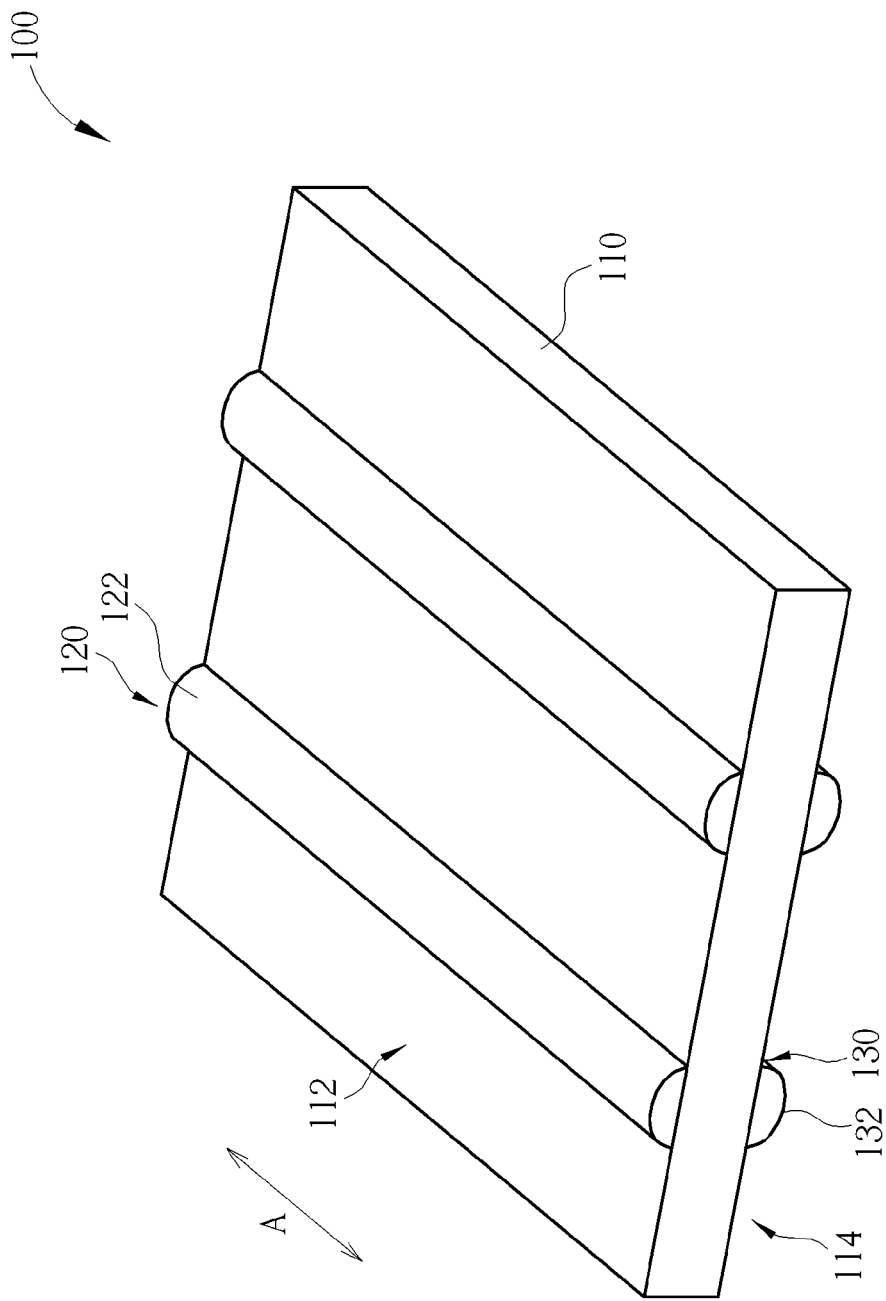
FIG. 1 is a diagram showing a solar cell of the prior art.
Figure 2:
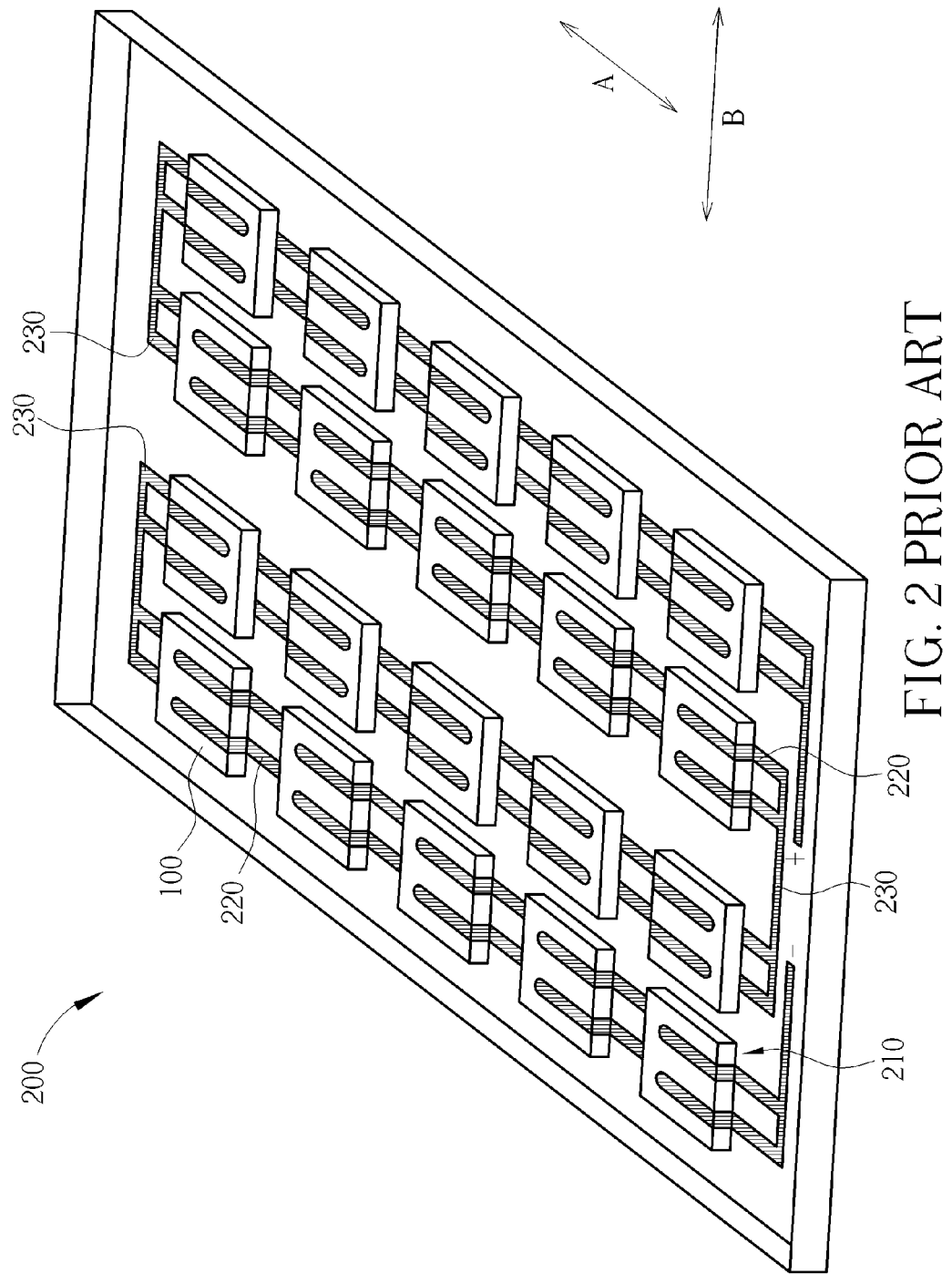
FIG. 2 is a diagram showing a solar cell module comprising the solar cells of FIG. 1.
Figure 3:
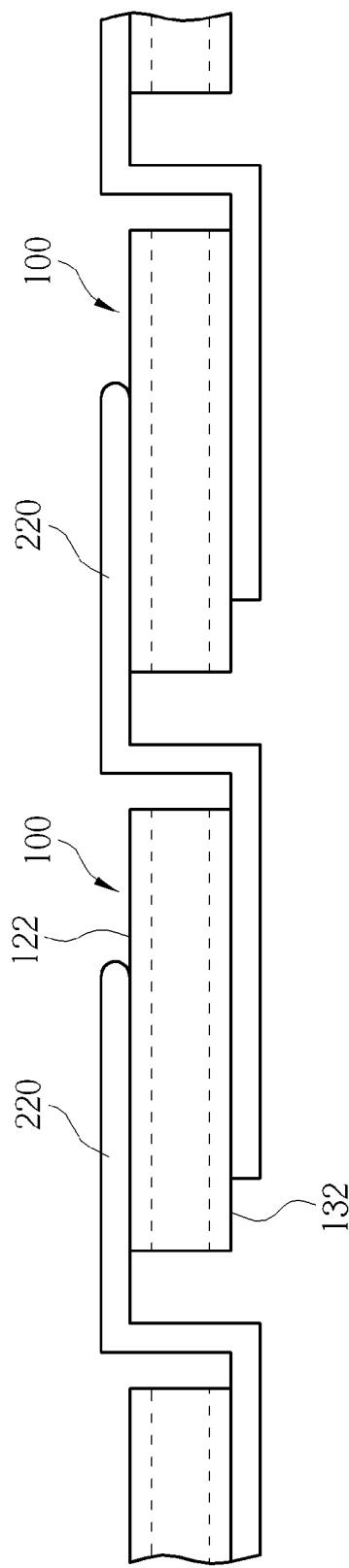
FIG. 3 is a diagram showing connections between the solar cells of the solar cell module of FIG. 2.
Figure 5:
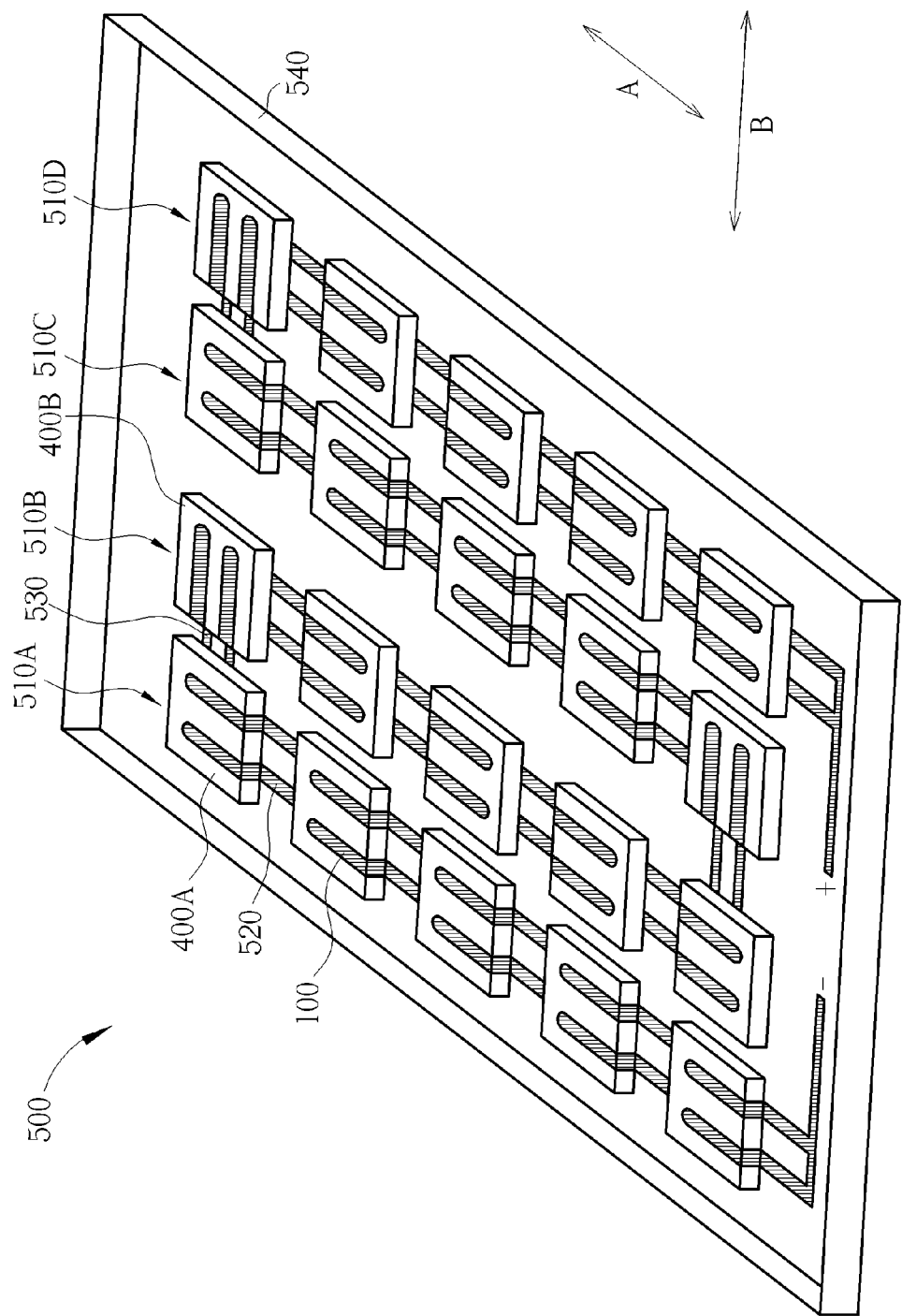
FIG. 5 is a diagram showing an embodiment of a solar cell module of the present invention.
Figure 6:
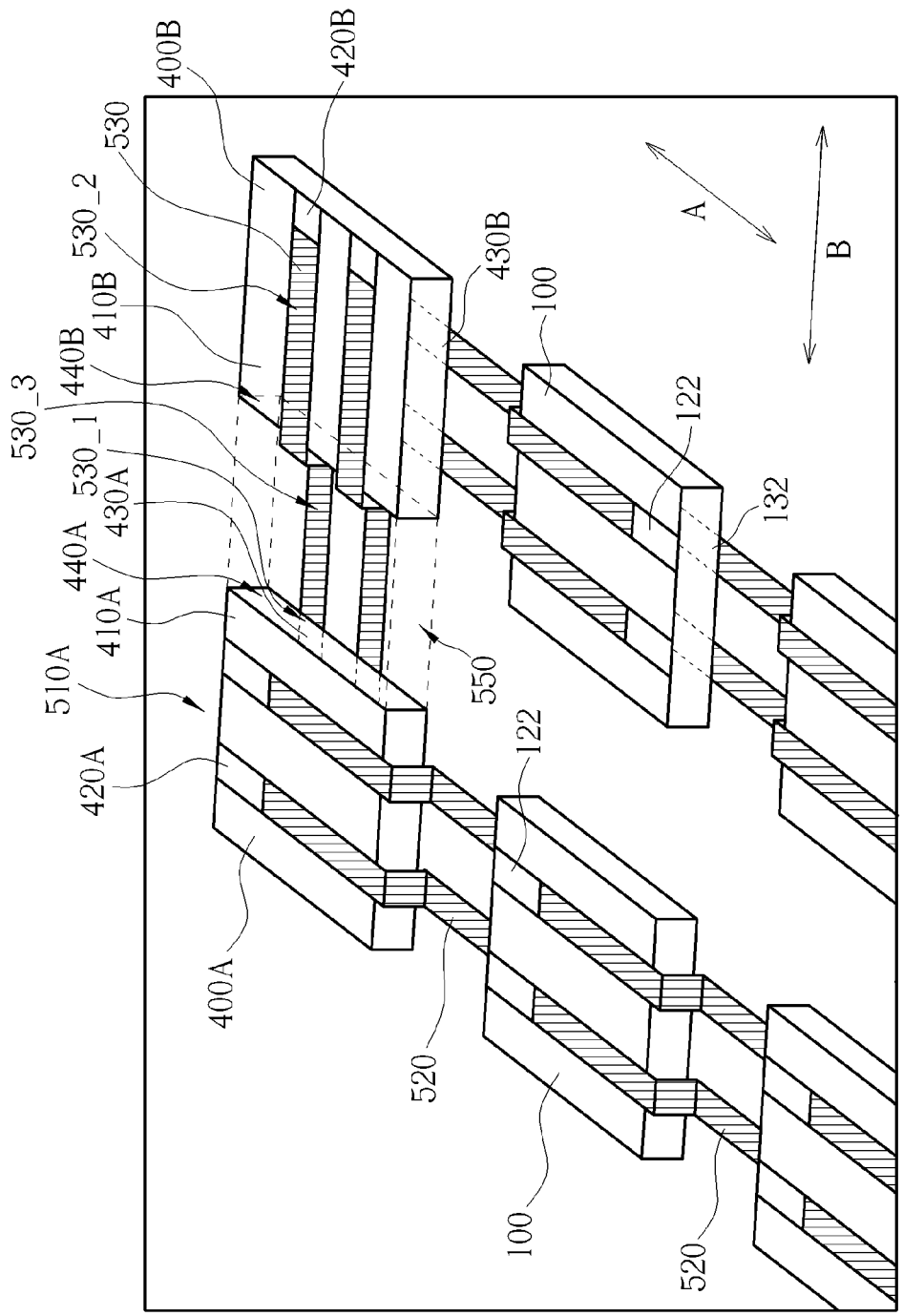
FIG. 6 is a diagram showing connections between bridge solar cells of the solar cell module of FIG. 5.
Figure 7:
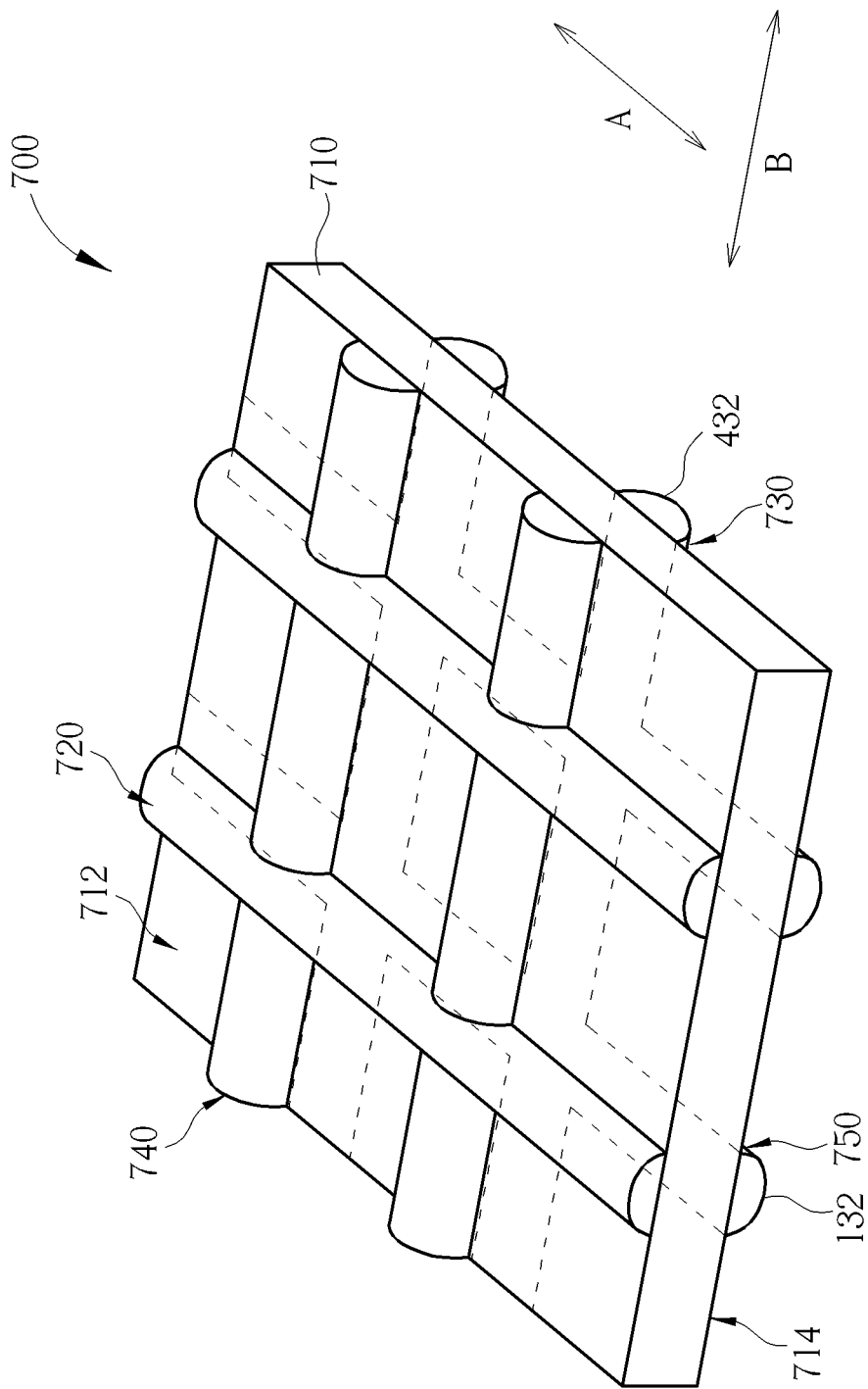
FIG. 7 is a diagram showing a second embodiment of the solar cell of the present invention.
Figure 8:
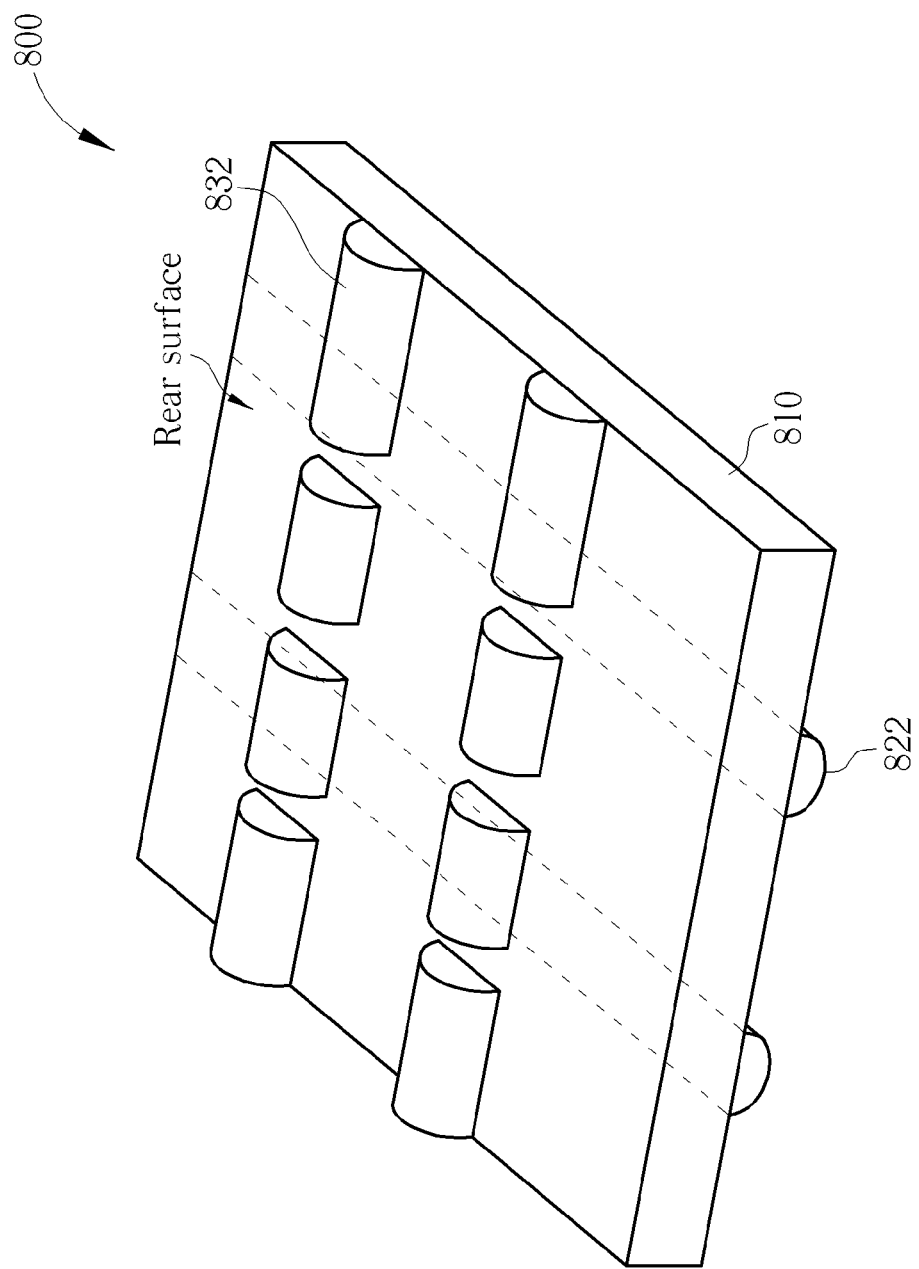
FIG. 8 is a diagram showing a third embodiment of the solar cell of the present invention.
Figure 9:
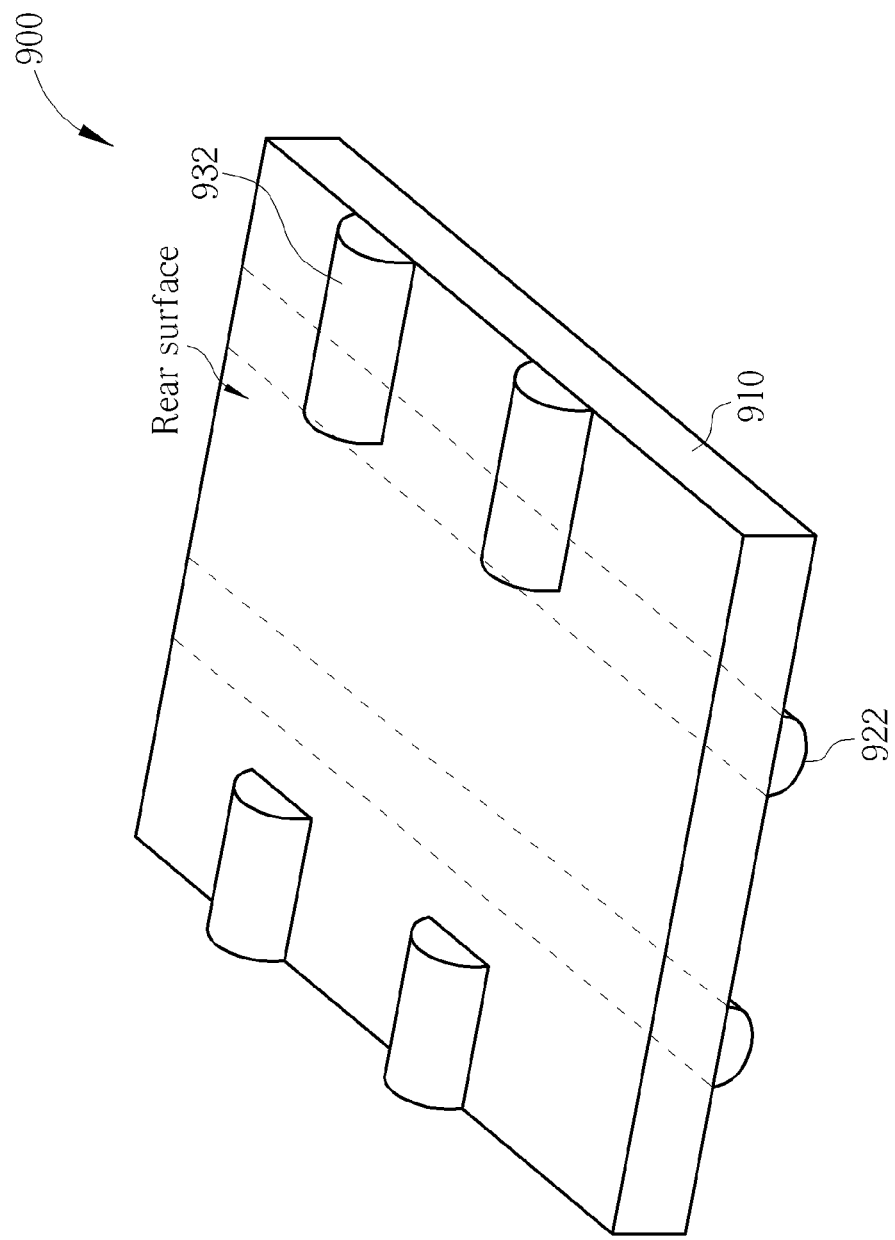
FIG. 9 is a diagram showing a fourth embodiment of the solar cell of the present invention.

Please refer to FIG. 5 and FIG. 6. FIG. 5 is a diagram showing an embodiment of a solar cell module of the present invention. FIG. 6 is a diagram showing connections between bridge solar cells of the solar cell module of FIG. 5. The solar cell module 500 comprises a plurality of solar cell strings 510A, 510B, 510C, 510D. Each of the solar cell strings 510A, 510B, 510C, 510D comprises a plurality of solar cells 100 (as shown in FIG. 1) and at least one solar cell 400 (as shown in FIG. 1) electrically connected to each other in series along a first direction A. The front contact electrode 122 of each solar cell 100 is electrically connected to the rear contact electrode 132 of adjacent solar cell 100 via a first conducting strip 520. The solar cell module 500 further comprises second conducting strips 530 arranged along a second direction B for electrically connecting the solar cell strings 510 in series. The second conducting strips 530 are utilized for electrically connecting bridge solar cells 400A, 400B of the solar cell strings in series. Structure of the bridge solar cells 400A, 400B is the same as structure of the solar cell 400 (as shown in FIG. 4), the solar cell 700 (as shown in FIG. 7), the solar cell 800 (as shown in FIG. 8) or the solar cell 900 (as shown in FIG. 9). As shown in FIG. 6, the rear bus 430A of the bridge solar cell 400A of the solar cell string 510A is located on the rear surface of the substrate 410A along the second direction B, and the front bus 420B of the bridge solar cell 400B of the solar cell string 510B is located on the front surface of the substrate 410B along the second direction B, such that the second conducting strips 530 can be directly coupled to the bridge solar cell 400A of the solar cell strings 510A to the bridge solar cell 400B of the solar cell strings 510B in series along the second direction B. Moreover, the front bus 420A of the bridge solar cell 400A can be perpendicular to the rear bus 430A, and the rear bus 430B of the bridge solar cell 400B can be perpendicular to the front bus 420B, such that the front bus 420A of the bridge solar cell 400A can be electrically connected with other solar cell 100 of the solar cell string 510A along the first direction A, and the rear bus 430B of the bridge solar cell 400B can be electrically connected with other solar cell 100 of the solar cell string 510B along the first direction A. In addition, the solar cells 100, 400 are generally located on an insulation back plate 540. The solar cell strings 510A, 510B, 510C, 510D may be arranged along different directions.

In other words, as shown in FIG. 6, the bridge solar cell 400A has a first lateral surface 440A, and bridge solar cell 400B has a second lateral surface 440B facing to the first lateral surface 440A. A first space 550 is formed between four edges of the first lateral surface 440A and four edges of the second lateral surface 440B. In addition, the second conducting strip 530 can be divided to a first contact part 530_1, a second contact part 530_2, and a transmission part 530_3. The first contact part 530_1 is electrically connected to the rear bus 430A of the bridge solar cell 400A, the second contact part 530_2 is electrically connected to the front bus 420B of the bridge solar cell 400B, and the transmission part 530_3 is connected between the first contact part 530_1 and the second contact part 530_2, wherein the transmission part 530_3 is arranged inside the first space.

According to the above arrangement, the solar cell module 500 of the present invention can save a extra space around the solar cell strings 510A, 510B, 510C, 510D from installing the conducting bars to electrically connect the solar cell strings 510A, 510B, 510C, 510D in series. Therefore, the size of the solar cell module 500 can be further reduced. In addition, compared with the solar cell module of the prior art, overall length of conducting wire of the solar cell module 500 of the present invention is shorter, such that the solar cell module 500 of the present invention has lower resistance, which reduces power consumption.

Please refer to FIG. 7. FIG. 7 is a diagram showing a second embodiment of the solar cell of the present invention. As shown in FIG. 7, the solar cell 700 comprises a first front bus 720, a second front bus 740, a first rear bus 730, and a second rear bus 750. The first front bus 720 is located on the front surface 712 of the substrate 710 along the first direction A. The second front bus 740 is located on the front surface 712 of the substrate 710 along the second direction B. The first rear bus 730 is located on the rear surface 714 of the substrate 710 along the second direction B. The second rear bus 750 is located on the rear surface 714 of the substrate 710 along the first direction A. Thus, the solar cell 700 can be utilized as one of the solar cells of the solar cell module 500 (as shown in FIG. 5).

Please refer to FIG. 8. FIG. 8 is a diagram showing a third embodiment of the solar cell of the present invention. As shown in FIG. 8, besides the rear contact electrode 832 of the solar cell 800 being perpendicular to the front contact electrode 822, the rear contact electrode 832 of the solar cell 800 comprises a plurality of contact surfaces adjacent to each other. In other words, the rear contact electrode 832 of the solar cell 800 comprises a plurality of contact surfaces sequentially arranged along the second direction B.

Please refer to FIG. 9. FIG. 9 is a diagram showing a fourth embodiment of the solar cell of the present invention. As shown in FIG. 9, besides the rear contact electrode 932 of the solar cell 900 being perpendicular to the front contact electrode 922, the rear contact electrode 932 of the solar cell 900 comprises two contact surfaces arranged at opposite edges of the rear surface of the substrate 910 respectively.

The above solar cell 800, 900 can also be utilized as the bridge solar cell of the solar cell module 500 shown in FIG. 5.

In addition, it is not necessary for the rear contact electrode to be perpendicular to the front contact electrode, in the present invention, the rear contact electrode can be arranged along any other direction different from the direction of the front contact electrode.

The rear contact electrode and the front contact electrode of the solar cell of the embodiments of the present invention can be arranged along different directions, such that the solar cell strings of the solar cell module of the present invention can be directly coupled to each other via the second conducting strip, so as to further reduce size of the solar cell module. Besides, the overall length of conducting wire of the solar cell module can be reduced, such that the solar cell module of the present invention has better efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A solar cell configured to electrically connect to a first conducting strip and electrically connect to a second conducting strip, the solar cell comprising:
   a substrate, having a front surface and a rear surface;
   a first front bus, located on the front surface of the substrate along a first direction for collecting current generated by the substrate, wherein the first front bus provides a first front contact electrode contacting to the first conducting strip; and
   a first rear bus, located on the rear surface of the substrate along a second direction different from the first direction for collecting current generated by the substrate, wherein the first rear bus provides a first rear contact electrode contacting to the second conducting strip.

2. The solar cell of claim 1, further comprising:
   a second front bus, located on the front surface of the substrate along the second direction for collecting current generated by the substrate, and for providing a second front contact electrode; and
   a second rear bus, located on the rear surface of the substrate along the first direction for collecting current generated by the substrate, and for providing a second rear contact electrode.

3. The solar cell of claim 1, wherein the first rear contact electrode comprises a plurality of electrodes sequentially arranged along the second direction.

4. The solar cell of claim 3, further comprising:
   a plurality of front finger bus, extended from and electrically connected to the first front bus.

5. The solar cell of claim 1, wherein the first rear contact electrode comprises two contact surfaces arranged at opposite edges of the rear surface of the substrate respectively.

6. The solar cell of claim 5, further comprising:
   a plurality of front finger bus, extended from and electrically connected to the first front bus.

7. The solar cell of claim 1, further comprising:
   a plurality of front finger bus, extended from and electrically connected to the first front bus.

8. A solar cell module, comprising:
   a first solar cell string, comprising a plurality of first solar cells electrically connected to each other in series along a first direction, the plurality of first solar cells comprising a first bridge solar cell;
   a second solar cell string, comprising a plurality of second solar cells electrically connected to each other in series, the plurality of second solar cells comprising a second bridge solar cell; and
   a first conducting strip, for electrically connecting a surface of the first bridge solar cell to a surface of the second bridge solar cell along a second direction different from the first direction;
   wherein the plurality of second solar cells are electrically connected to each other in series along a third direction different from the second direction;
   wherein the first bridge solar cell has a first plain lateral surface, the second bridge solar cell has a second plain lateral surface facing toward the first plain lateral surface, a first space is defined by the first plain lateral surface, the second plain lateral surface and four virtual lines connected between four corners of the first plain lateral surface and four corners of the second plain lateral surface, the first conducting strip extends from the surface of the first bridge solar cell to the surface of the second bridge solar cell through the first space without protruding out of the first space between the first bridge solar cell and the second bridge solar cell;
   wherein the first bridge solar cell has a first front contact electrode arranged on a front side of the first bridge solar cell along the first direction, and a first rear contact electrode arranged on a rear side of the first bridge solar cell along the second direction, the first front contact electrode contacts a second conducting strip to be electrically connected to a first solar cell of the first solar cell string via the second conducting strip, the first rear contact electrode contacts the first conducting strip to be electrically connected to the second bridge solar cell via the first conducting strip.

9. The solar cell module of claim 8, wherein the first bridge solar cell comprises:
   a first substrate, having a front surface and a rear surface, the front surface of the first substrate being utilized for receiving light;
   a first front bus, located on the front surface of the first substrate along the first direction for collecting current generated by the first substrate, and for providing the first front contact electrode; and
   a first rear bus, located on the rear surface of the first substrate along the second direction for collecting current generated by the substrate, and for providing the first rear contact electrode; and
   wherein the second bridge solar cell comprises:
   a second substrate, having a front surface and a rear surface, the front surface of the second substrate being utilized for receiving light;
   a second front bus, located on the front surface of the second substrate along the second direction for collecting current generated by the second substrate, and for providing a second front contact electrode electrically connected to the first rear contact electrode of the first bridge solar cell; and
   a second rear bus, located on the rear surface of the second substrate along the third direction for collecting current generated by the second substrate, and for providing a second rear contact electrode.

10. The solar cell of claim 9, wherein one of the first front contact electrode, the first rear contact electrode, the second front contact electrode and the second rear contact electrode comprises a plurality of electrodes adjacent to each other.

11. The solar cell of claim 9,
   wherein the second rear contact electrode of the second bridge solar cell contacts a third conducting strip, and the second bridge solar cell is electrically connected to a second solar cells of the second solar cell string via the third conducting strip; and
   wherein the first bridge solar cell is electrically connected to the second front contact electrode of the second bridge solar cell via the first conducting strip.

12. The solar cell module of claim 9, wherein the first rear contact electrode comprises two contact surfaces arranged at opposite edges of the rear surface of the first substrate respectively.

13. The solar cell module of claim 12, further comprising:
   a plurality of front finger bus, extended from and electrically connected to the first front bus.

14. The solar cell module of claim 9, further comprising:
   a plurality of front finger bus, extended from and electrically connected to the first front bus.

15. The solar cell module of claim 8, wherein the third direction is different from the first direction.

16. A solar cell module, comprising:
   a first solar cell string, comprising a plurality of first solar cells electrically connected to each other in series along a first direction, the plurality of first solar cells comprising a first bridge solar cell with a first plain lateral surface;

a second solar cell string, comprising a plurality of second solar cells electrically connected to each other in series along a third direction, the plurality of second solar cells comprising a second bridge solar cell with a second plain lateral surface opposite to the first plain lateral surface, a first space is formed between four edges of the first plain lateral surface and four edges of the second plain lateral surface; and a first conducting strip, for electrically connecting the first bridge solar cell to the second bridge solar cell, the first conducting strip having a first contact part, a second contact part, and a transmission part, wherein the first contact part is electrically connected to the first bridge solar cell, the second contact part is electrically connected to the second bridge solar cell, and the transmission part connected between the first contact part and the second contact part is arranged inside the first space;

wherein the first bridge solar cell has a first front contact electrode arranged on a front side of the first bridge solar cell along the first direction, and a first rear contact electrode arranged on a rear side of the first bridge solar cell along a second direction different from the first direction, the first front contact electrode contacts a second conducting strip to be electrically connected to a first solar cell of the first solar cell string via the second conducting strip, the first rear contact electrode contacts the first conducting strip to be electrically connected to the second bridge solar cell via the first conducting strip.

17. The solar cell module of claim 16, wherein the first conducting strip is arranged along the second direction different from the first direction and the third direction.

18. The solar cell module of claim 16, wherein the third direction is different from the first direction.

* * * * *